(12) United States Patent
Padalia et al.

(10) Patent No.: US 7,275,228 B1
(45) Date of Patent: Sep. 25, 2007

(54) TECHNIQUES FOR GROUPING CIRCUIT ELEMENTS INTO LOGIC BLOCKS

(75) Inventors: Ketan Padalia, Thornhill (CA);
Kimberly Bozman, Toronto (CA);
Vaughn Betz, Toronto (CA)

(73) Assignee: Altera Corporation, San Jose, CA (US)

( * ) Notice: Subject to any disclaimer, the term of this patent is extended or adjusted under 35 U.S.C. 154(b) by 7 days.

(21) Appl. No.: 10/716,309

(22) Filed: Nov. 17, 2003

(51) Int. Cl.
G06F 9/45 (2006.01)
G06F 17/50 (2006.01)

(52) U.S. Cl. .................. 716/10; 716/8; 716/9; 716/11; 716/16

(58) Field of Classification Search ............ 716/4, 716/7, 1, 16, 8–11; 703/19; 714/733
See application file for complete search history.

(56) References Cited

U.S. PATENT DOCUMENTS

| | | | | |
|---|---|---|---|---|
| 4,630,219 A * | 12/1986 | DiGiacomo et al. | ......... | 716/9 |
| 5,550,839 A * | 8/1996 | Buch et al. | ......... | 714/724 |
| 5,818,726 A * | 10/1998 | Lee | ......... | 716/10 |
| 6,099,583 A * | 8/2000 | Nag | ......... | 716/16 |
| 6,714,903 B1 * | 3/2004 | Chu et al. | ......... | 703/19 |
| 6,813,754 B2 * | 11/2004 | Wu et al. | ......... | 716/10 |
| 6,957,412 B1 * | 10/2005 | Betz et al. | ......... | 716/16 |
| 6,968,514 B2 * | 11/2005 | Cooke et al. | ......... | 716/1 |
| 2001/0003843 A1 * | 6/2001 | Scepanovic et al. | ......... | 716/7 |
| 2002/0091979 A1 * | 7/2002 | Cooke et al. | ......... | 714/733 |

OTHER PUBLICATIONS

"Introduction to Quartus® II," product manual, chapter 5, pp. 74-155, Altera Corporation San Jose, CA (2003).
"Using the Quartus II Chip Editor," Application Note 310, version 1.0, Altera Corporation San Jose, CA (Jun. 2003).

* cited by examiner

*Primary Examiner*—Paul Dinh
*Assistant Examiner*—Nghia M. Doan
(74) *Attorney, Agent, or Firm*—Townsend and Townsend and Crew LLP

(57) ABSTRACT

Techniques are provided for grouping circuits in a user design for a programmable integrated circuit into logic blocks. A packing tool separates each circuit element into individual abstract blocks and groups the abstract block into logic blocks. A determination is made whether placement information indicates that a design goal would be improved by rearranging at least a portion of the user design. The user design can be rearranged by moving one or more of the abstract blocks into different logic blocks than the ones they were previously grouped with. Circuit elements in the same logic block can be separated and placed into different logic blocks to improve routability of the user design and signal timing.

27 Claims, 5 Drawing Sheets

TECHNIQUES FOR GROUPING CIRCUIT ELEMENTS INTO LOGIC BLOCKS

BACKGROUND OF THE INVENTION

The present invention relates to techniques for grouping circuits into logic blocks, and more particularly, to techniques for grouping lookup tables, registers and other circuits into logic blocks that allow the circuits to be separated and moved independently during placement of a circuit design for a programmable integrated circuit.

A field programmable gate array (FPGA) is a programmable integrated circuit. Programmable integrated circuits also include programmable logic devices (PLDs), programmable logic arrays (PLAs), configurable logic arrays, etc. Many programmable integrated circuits are hybrids of FPGAs and ASICs (application specific integrated circuits).

Programmable integrated circuits typically include configurable logic blocks, programmable routing resources, and programmable input/output (I/O) blocks. Configurable logic blocks typically contain combinatorial components such as multiplexers and lookup tables as well as sequential components such as registers. Logic blocks implement user defined logic functions.

Lookup tables are the basic logic circuit in many of today's FPGAs. A lookup table (LUT) includes memory cells that can store the truth tables of an arbitrary function. A LUT with k inputs can implement a function with k input variables. The binary value of the input signals are used as a memory address to access one of the LUT memory locations. The LUT outputs the bits that are stored in the accessed memory location.

Lookup tables and other circuits in the FPGA are selected to implement equivalent functions performed by circuits in the user design. This selection process involves synthesis and technology mapping. During technology mapping, networks of logic gates in the user-made design are transformed into circuits such as LUTs and registers that can be placed onto the FPGA.

The user-made design is converted into a netlist. The netlist pattern organizes the LUTs and registers into logic blocks. The LUTs and registers cannot be subsequently removed from the logic blocks without violating design rules of the FPGA. The logic blocks are typically grouped into clusters of logic blocks based on routing and timing issues. The clusters of logic blocks are often called logic array blocks (LABs).

After synthesis and technology mapping, a placement tool places each of the LABs generated during synthesis to particular LABs on the FPGA. A routing tool then configures the programmable routing resources on the FPGA to connect the LABs together according to the requirements of the user design.

During placement, routability and timing issues between logic blocks become apparent that were not apparent during synthesis. For example, a synthesis tool may group a LUT and a register in the same logic block. During placement, it may become clear that routability would be improved if the LUT and the register were placed into different logic blocks on an FPGA.

However, a placement tool cannot separate the LUT and register without potentially violating design rules of the FPGA. FPGAs have design rules that limit which LUTs and registers can be placed into the same logic block and the same LAB. The design rules are constraints imposed by the particular architecture of the FPGA.

Therefore, it would be desirable to provide techniques for grouping LUTs and registers into logic blocks so that they can be more flexibly rearranged without violating design rules of the programmable integrated circuit.

BRIEF SUMMARY OF THE INVENTION

The present invention provides techniques for grouping circuits elements (e.g., LUTs and registers) into logic blocks on a programmable integrated circuit (IC). A packing tool of the present invention organizes each of the circuit elements into separate abstract blocks. Each LUT, register, and other circuit element is grouped into a separate abstract block. The abstract blocks are then grouped into logic blocks based on routing and timing concerns.

Subsequently, a determination is made whether placement information indicates that a design goal would be improved by rearranging at least a portion of the user design. The user design can be rearranged by placing one of the abstract blocks into a different logic block.

Individual abstract blocks can be separated and moved independently of other circuits that were previously grouped into the same logic block. For example, a LUT and register that were previously placed into the same logic block can be separated. The LUT and the register can be placed into different logic blocks to further improve routability of the design and signal timing.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1:
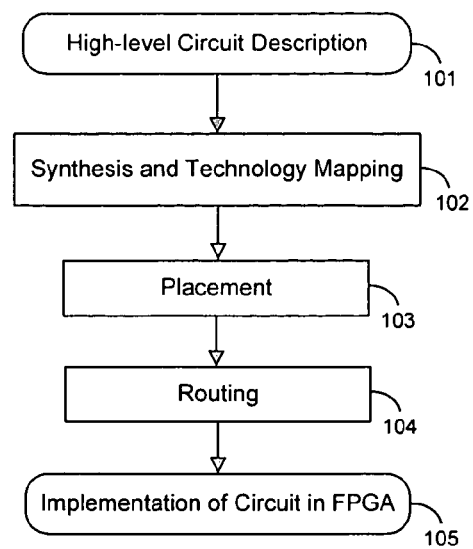
FIG. 1 illustrates a generalized process for mapping a user made circuit design to a programmable integrated circuit that can be modified to implement techniques of the present invention.

FIG. 1 is flow chart that illustrates a generalized process for mapping a user made circuit design to a programmable integrated circuit (IC) such as an FPGA or a PLD. The first step 102 in this mapping process involves synthesis and technology mapping. During synthesis and technology mapping, networks of logic gates in a user circuit design 101 are converted into circuit elements that can be placed into a programmable IC. The logic gates can be converted into various types of circuit elements such as lookup tables (LUTs), registers, RAM, and digital signal processing (DSP) blocks, depending on the particular programmable IC architecture.

During placement step 103, a packing tool of the present invention groups the LUTs, registers, and other circuit blocks generated during technology mapping into logic blocks. Each logic block typically includes at least one LUT and at least one register. Logic blocks can be grouped into clusters of logic blocks such as a LAB on a programmable IC. A placement tool then places these logic blocks into actual logic blocks based on the geography of a programmable IC.

The next step 104 involves routing. During routing, the LABs and logic blocks are connected together by programming the routing resources.

The placement of the circuit blocks can greatly effect timing and routability of the user made design. Logic blocks and LABs that interconnect should be placed close to each other on the programmable IC to reduce the demand on the routing resources and to reduce signal propagation times. As discussed above, prior art tools grouped LUTs and registers into logic blocks that could not be separated during placement to improve timing and routability of the user design.

Figure 2:
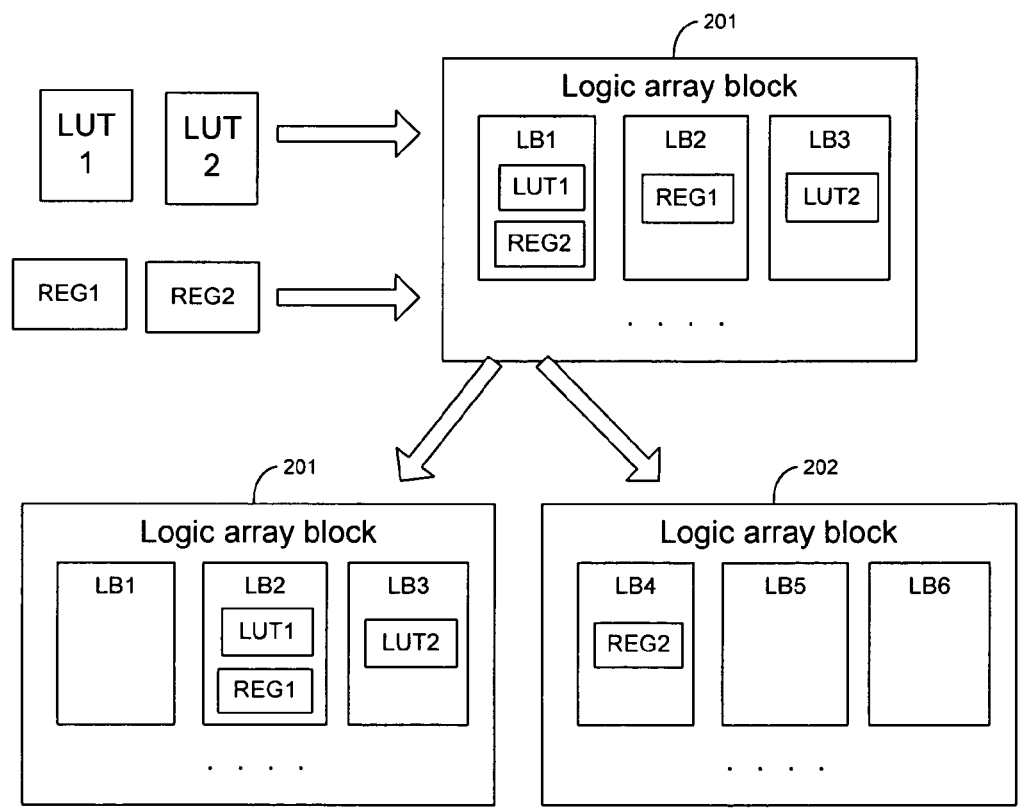
FIG. 2 graphically illustrates how a packing tool can map an abstract block to a logic block and a cluster of logic blocks according to an embodiment of the present invention.

The present invention solves this problem by separating each LUT and register into separate abstract blocks that can be subsequently broken up. FIG. 2 graphically illustrates an embodiment of the present invention. A packing tool of the present invention separates LUT1, LUT2, register 1 and register 2 into separate abstract blocks as shown in the upper left corner of FIG. 2. The packing tool then groups the LUTs and registers into a logic array block (LAB) 201. The LAB includes several logic blocks.

Some of the LUTs and registers can be combined into the same logic blocks as shown in FIG. 2. For example, LUT 1 and register 2 are both grouped inside logic block LB1. In the FIG. 2 example, the packing tool places at least one logic block and at least one register inside each logic block. Even though some of the LUTs and registers are grouped into the same logic block, the present invention treats each LUT and each register as a separate block so that they can be moved into different logic blocks at anytime.

The present invention allows circuits (e.g., LUTs and registers) that are grouped into one logic block to be separated and regrouped into separate logic blocks or separate LABs before, during, or after placement and routing. A placement tool of the present invention has the ability to separate a LUT and a register in a logic blocks to improve the routability and timing of a user design for a programmable IC.

FIG. 2 illustrates an example of how a placement tool can separate a LUT and a register that have been grouped into the same logic block. As shown in FIG. 2, LUT1 and register REG2 were both placed inside logic block LB1 of LAB 201 initially.

A placement tool may subsequently determine that the demand on the programmable interconnect routing resources would be significantly reduced if REG2 were moved into LAB 202. After making this determination, the placement tool moves REG2 to LB4 in LAB 202. The placement tool can also move LUT1 to a different logic block or a different LAB to further improve routability and/or timing. In the example of FIG. 2, the placement tool moves LUT1 to logic block LB2.

Figure 3:
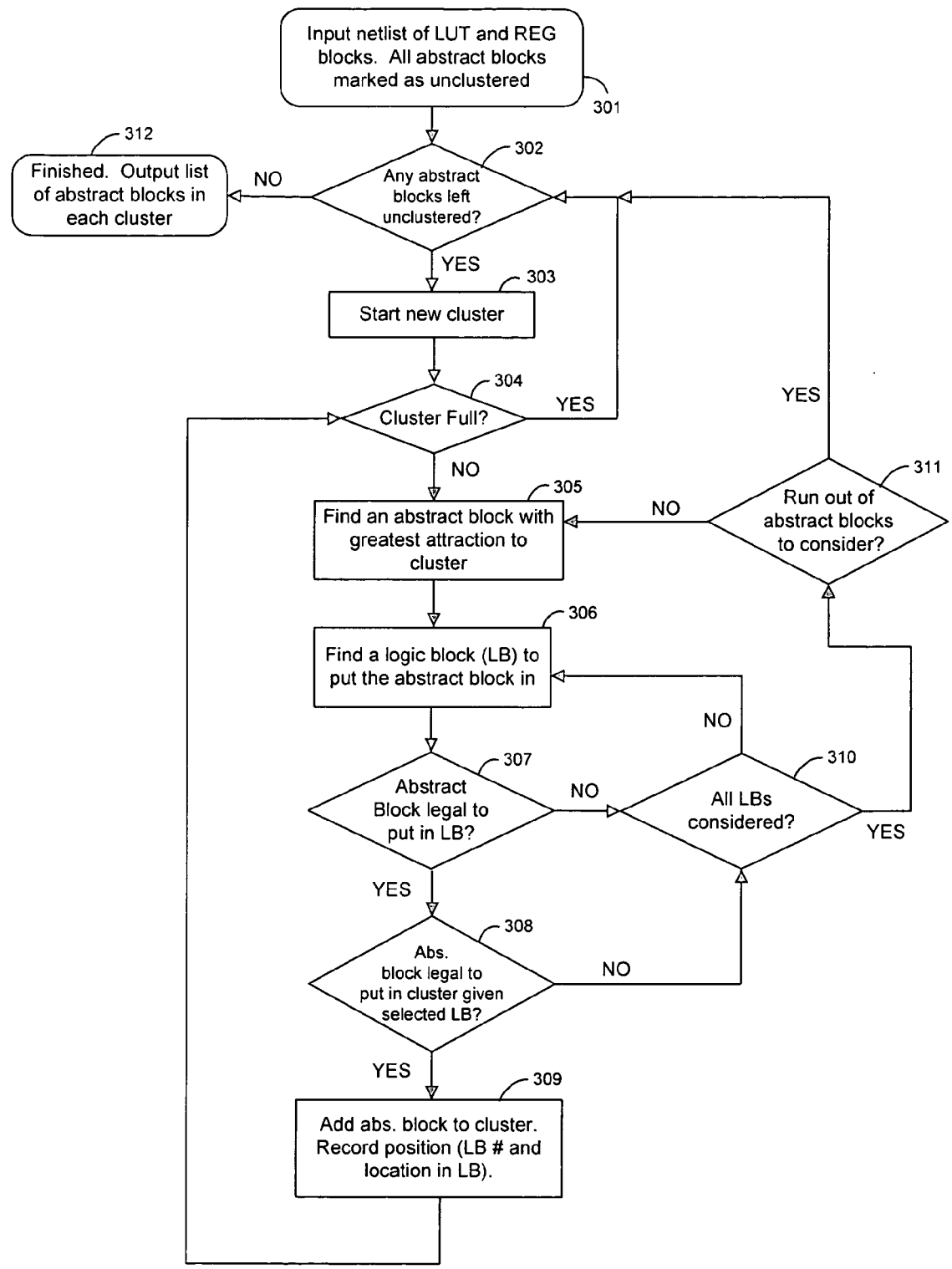
FIG. 3 illustrates a process for grouping logic blocks into logic blocks and clusters of logic blocks according to the principles of the present invention.

All design rules of the programmable IC should be satisfied before a LUT or a register is grouped into a logic block and a LAB. FIG. 3 illustrates a process that can be implemented by a packing tool according to an embodiment of the present invention. In the process of FIG. 3, abstract blocks are grouped into clusters of logic blocks (e.g., a LAB) only if the design rules are satisfied. Each abstract block includes only one circuit element, for example, one LUT, one register, one DSP block, one RAM block, or one of another type of circuit block. The abstract blocks are grouped into the clusters based on timing and routing issues.

The process illustrated in FIG. 3 is merely one example of the present invention, and is not intended to limit the scope of the present invention. The process of FIG. 3 is now discussed in detail.

As discussed above, technology mapping generates a netlist 301 of lookup tables, registers (e.g., flip-flops), and other circuits that perform functions in a user made design for a programmable IC. Each circuit is grouped into a separate abstract block. The abstract blocks are not associated with clusters of abstract blocks, and are therefore marked as unclustered. Netlist 301 is the input to the process of FIG. 3.

At decisional step 302, the packing tool determines if any of the abstract blocks in netlist 301 are not associated with a cluster. Because all of the abstract blocks that are in netlist 301 are initially unclustered, the packing tool proceeds to step 303. At step 303, the tool creates a new cluster. A cluster corresponds to a group of configurable logic blocks on a programmable IC, such as a logic array block (LAB).

At decisional step 304, the packing tool determines whether the cluster created at step 303 is full. At this point, the cluster has just been created, so it not full. At step 305, the packing tool locates an abstract block in netlist 301 that has the greatest attraction to the cluster created at step 303. Attraction is a function of the effect that placing the abstract block inside the cluster has on the routing resources (i.e., routability). Attraction is also a function of the timing constraints placed on the user made design that would be caused by placing the abstract block inside the cluster. Equation (1) is an example of how the attraction of an abstract block to a cluster can be calculated.

$$\text{attraction(block)} = (\alpha * \text{routability\_attraction(block)} + ((1-\alpha) * \text{tim\_attraction(block)})) \quad (1)$$

The variable "routability_attraction(block)" is a variable that indicates how many nets and connections of nets will be absorbed into a cluster if the abstract block is placed inside the cluster. The routability_attraction variable is greater for abstract blocks that will result in more nets being absorbed into the cluster. To a lesser extent, the variable "routability_attraction" is greater for abstract blocks that result in more connections of nets being absorbed into a cluster.

A net (or network) includes the connections from one terminal to one or more other terminals. For example, an output of a LUT may be connected to an input of register, an input of a multiplier, and an input/output pin. The net for the output of the LUT includes all three of the connections to the register, the multiplier, and the I/O pin.

The variable "tim_attraction(block)" is a variable that indicates how many timing critical connections are absorbed into a cluster if the abstract block is placed inside the cluster. The tim_attraction(block) is greater for abstract blocks that will result in a timing critical connection being absorbed into the cluster. When a connection is absorbed into a cluster, that connection can use fast local routing resources.

The a variable is a tradeoff factor between routability and timing. The tradeoff factor can be varied between 1 and 0 depending on the relative importance of routability for specific user designs.

After the abstract block that has the greatest attraction to the cluster is located, the packing tool selects a logic block within the cluster to place the abstract block in, at step 306. FIG. 2 illustrates how the packing tool places abstract blocks such as LUTs and registers into logic blocks within a LAB cluster. At decisional step 307, the packing tool determines whether placing the abstract block into the logic block selected at step 306 violates any design rules of the programmable IC. At decisional step 308, the packing tool determines whether placing the abstract block into the cluster violates any of the design rules.

Because each abstract block in netlist 301 has only one circuit element (e.g., a LUT or register), the determination as to whether the abstract block can be legally placed into the cluster and the logic block is more complex. The added complexity is the result of the fact that logic blocks have their own set of design rules independent of the design rules for clusters. All of the design rules for the logic block and the cluster must be satisfied before the abstract block is added to the logic block and the cluster.

Figure 4:
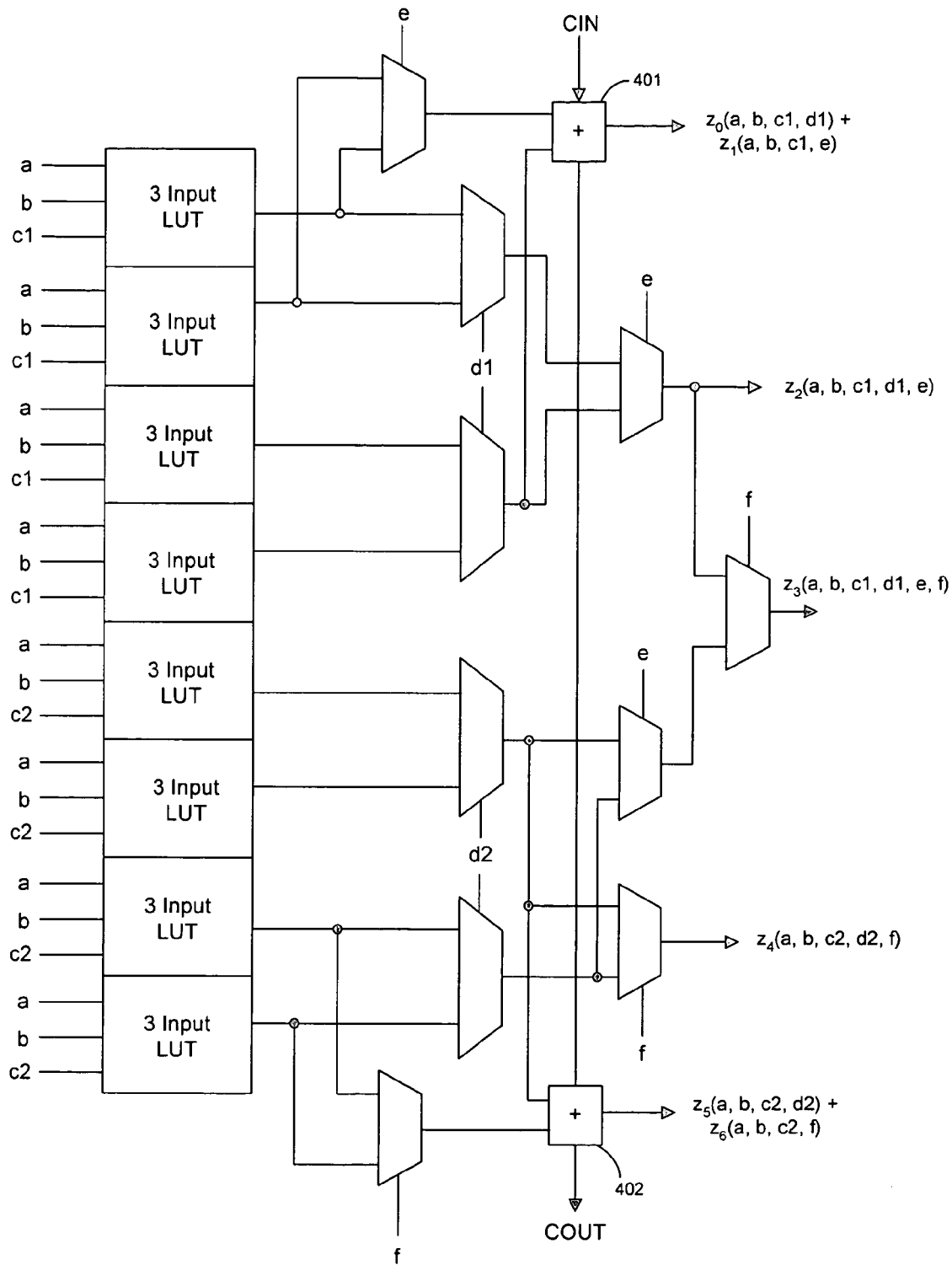
FIG. 4 illustrates an example of a logic block with a lookup table that can be used to according to the techniques of the present invention.

FIG. 4 shows an example of a portion of a logic block. The logic block portion shown in FIG. 4 illustrates examples of design rules that must be satisfied before an abstract block is placed into the logic block. The logic block of FIG. 4 includes eight 3-input LUTs and 10 multiplexers that route output signals of the LUTs. The logic block also has two adder circuits 401 and 402 that are coupled together. Adder circuit 402 receives a carry input signal CIN from an adjacent logic block, and adder circuit 401 generates a carry output signal COUT that is transmitted to another adjacent logic block.

The logic block of FIG. 4 receives at most 8 unique input variables a, b, c1, c2, d1, d2, e and f. This logic block can be configured to implement several different functions. For example, the logic block can be configured as two 5-input or one 6-input lookup table. When implemented as two LUTs, the logic block of FIG. 4 implements two functions and generates two output signals.

As specific example, the logic block of FIG. 4 can be implemented as two 5-input LUTs that implement addition functions and that generate two output signals. Adder circuit 401 generates the first output signal, which is the addition of function $z_0$(a, b, c1, d1) and function $z_1$(a, b, c1, e). Adder circuit 402 generates the second output signal, which is the addition of function $z_5$(a, b, c2, d2) and function $z_6$(a, b, c2, f).

The logic block of FIG. 4 can also be configured as two 5-input lookup tables that do not use the adder circuits. In this example, the first lookup table generates output signal $z_2$(a, b, c1, d1, e), and the second lookup table generates output signal $z_4$(a, b, c2, d2, f). As a third example, the logic block of FIG. 4 can be configured as a single 6-input lookup table that receives 6 unique input variables and outputs the result of function $z_3$(a, b, c1, d1, e, f). Each of the output signals of the logic block is stored in a register (not shown).

Other LUT configurations for this logic block shown in FIG. 4 are possible if they meet the following requirements. First, the logic block can implement two LUTs, if the LUTs together have no more than 8 unique input variables. Second, if either one of the two LUTs is a six input LUT, both of the LUTs must perform the same function (i.e., have the same LUT mask).

The logic block of FIG. 4 is an example of a logic block that can implement the function of one LUT or two LUTs. The flexibility of this logic block adds complexity to the packing process. If the abstract block selected at step 305 is a LUT, a packing tool of the present invention determines whether the LUT can be placed into particular logic blocks based on how many input variables the LUT has.

For example, if the LUT has 6 inputs, it can only be grouped into a FIG. 4 type logic block that does not already have a LUT. Alternatively, a 6-input LUT can be placed into a FIG. 4 logic block, if that logic block already includes a LUT that performs the same function as the LUT being considered, and shares at least four of the same input signals. At step 307, the packing tool determines whether a 6-input LUT grouped into a logic block at step 306 satisfies these design rules.

Two 5-input LUTs can be grouped into the FIG. 4 logic block if the LUTs have 2 of the same input variables. The LUT block selected at step 305 cannot be grouped into a logic block if the LUT does not have at least 2 input variables in common with a LUT already grouped into that logic block. The packing tool checks whether this design rule is satisfied at step 307.

Two 4-input LUTs can be grouped into the FIG. 4 LE. At step 307, it is automatically legal to group two 4-input LUTs into the LE.

These are merely a few examples of the types of design rules that can govern the grouping of LUTs into logic blocks. Design rules are generally limited to the particular architecture of the logic block. The techniques of the present invention are applicable to many other types of architectures with different sets of design rules.

If grouping an abstract block into a logic block does not satisfy one of the design rules, the packing tool then determines if there are any other logic blocks in the cluster that the abstract block can be placed into, at decisional step 310. If there are additional logic blocks remaining, the logic block is selected at step 306, and then the packing tool determines whether grouping the abstract block into that logic block satisfies all of the logic block's design rules at step 307.

At decisional step 308, the packing tool determines whether it is legal to place the abstract block inside the cluster that includes the logic block selected at step 306. The packing tool makes the determination of whether it is legal to place a group of abstract blocks inside a cluster by counting how many different resources the cluster requires. For example, a cluster may be restricted to two clock inputs. In this example, the packing tool checks to make sure that the group of abstract blocks trying to go into a cluster does not use more than two distinct clocks in order to maintain a legal cluster.

In general, the legality checks performed at step 308 determine if grouping the abstract block into the cluster creates demands that exceed the cluster's resources. For example, placing an abstract block into a logic block may require more routing resources than the cluster has available and that have not already been assigned to other circuits.

Legality checks for clusters are typically not related to the specific ordering of logic blocks within the cluster. In general, rearranging the logic blocks in the cluster in any way does not affect the legality of that cluster. The order independence of the logic blocks is guaranteed by the legality checks that are performed at step 307. By ensuring that the abstract blocks are legally placed within logic blocks at step 307, the logic blocks can be rearranged within the cluster without effecting the legality of that cluster.

If the abstract block can be legally placed into the cluster, the packing tool adds the abstract block to the cluster at step 309, and the position of the logic block in the cluster is recorded (e.g., the logic block number and location of the abstract block within the logic block). Steps 304-310 are then repeated for additional abstract blocks until the cluster is full.

If an abstract block cannot be legally placed into the cluster, the packing tool determines if there are more logic blocks in the cluster that have not been considered at step 310. If there are more logic blocks left to consider, the tool selects one of the remaining logic blocks at step 306 and processes the legality checks of steps 307-308 again.

Once all of the logic blocks have been considered, the packing tool determines whether there are any abstract blocks left to consider at step 311. At step 311, the packing tool determines if any of the abstract blocks that have not been placed in a cluster have been considered for possible addition to the cluster. If there are abstract blocks remaining that have not been considered for addition to the cluster, the packing tool looks for the abstract block with the greatest attraction to the cluster at step 305, if the cluster is not full.

If there are no more remaining abstract blocks left to consider, the packing tool returns to step 302 to determine if there are any more unclustered abstract blocks remaining. If unclustered abstract blocks remain, the packing tool creates a new cluster and subsequent steps are repeated as discussed above. If there are no additional unclustered abstract blocks remaining at step 302, the packing tool terminates at step 312 and outputs a list of abstract blocks that have been grouped within each cluster.

According to further embodiments of the present invention, steps 307 and 308 can be omitted if the programmable IC architecture has only one type of LUT and one type of register in each logic block. In this embodiment, each of the LUT and register blocks in the netlist can be legally placed into any of the logic blocks, because the programmable IC only has one type of logic block.

The present invention also applies to programmable IC architectures that do not have LABs or clusters of logic blocks. According to these embodiments, the packing tool groups the LUT and register blocks into logic blocks, but not into clusters of logic blocks. The packing tool can also check whether the LUT or register can be legally grouped into a particular logic block. In these embodiments, a packing tool selects a logic block to put an abstract block in based on the attraction of the abstract block to the logic block.

By using a more abstract block that includes only one circuit element, the present invention optimizes the process of mapping LUTs, registers, and other circuit elements to logic blocks and clusters of logic blocks. During or after placement, a placement tool or routing tool may determine that an abstract block grouped into a cluster would be better placed into another cluster to save routing resources and/or to improve signal timing. The present invention allows an abstract block containing a single basic circuit element to be placed into a different logic block and/or a different cluster.

It is highly advantageous to provide this added flexibility, because the placement and routing processes reveal routing and timing concerns that are not apparent previously. The present invention allows the grouping decisions made during the process of FIG. 3 to be reversed so that an abstract block can be placed into a different logic block and/or a different cluster. The abstract blocks can be rearranged into different logic blocks and different clusters before, during, or after the placement process. The same legality checks discussed above are implemented to ensure the new positions of the abstract blocks are allowed by the architecture of the programmable IC. If an abstract block can be rearranged in a way that is legal and that would result in an overall beneficial effect on the placement of the user design, a packing tool of the present invention rearranges the abstract block.

Figure 5:
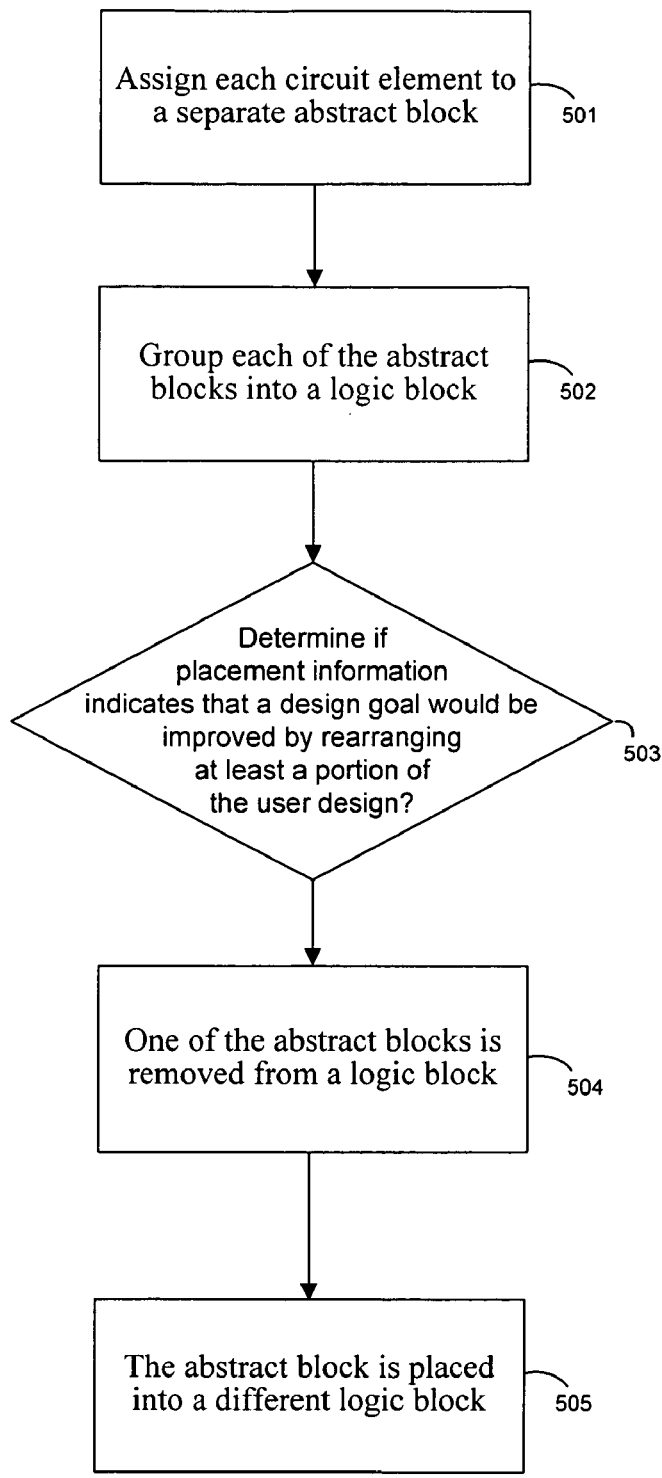
FIG. 5 illustrates an example of a process for grouping abstract blocks into logic blocks and separating abstract blocks from the logic blocks to improve design criteria according to an embodiment of the present invention.

FIG. 5 illustrates an example of a process of the present invention for grouping abstract blocks into logic blocks and separating abstract blocks from the logic blocks to improve design goals. At step 501, each circuit element is assigned to a separate abstract block. At step 502, each of the abstract blocks is grouped into a configurable logic block.

At decisional step 503, a determination is made whether placement information indicates that a design goal would be improved by rearranging at least a portion of the user design. The user design can be rearranged by moving one or more of the abstract blocks into different logic blocks than the ones they were grouped with in step 502.

Examples of design goals include signal timing and routability. Routability is generally improved by reducing a user design's use of routing resources. Signal timing is improved by reducing signal delay times in a user design.

Placement information includes geographical information that is gathered by attempting to locate at least a portion of the user design on the programmable integrated circuit (IC). Placement information can include data that is obtained by placing a portion of or all of a user design onto a programmable IC using a placement tool. Placement information can include information obtained from the placement of logic blocks onto a programmable IC.

Placement information can also include information obtained by floorplanning or partitioning. Floorplanning is performed by assigning blocks of a user design to regions of a programmable IC. Partitioning is performed by assigning half of a user design to one half of a programmable IC, and assigning the other half of the user design to the other half of the programmable IC. Each partitioned half of the user design can be further partitioned and assigned to smaller regions of the programmable IC. Partitioning and floorplanning do not require placing logic blocks of the user design onto the programmable IC.

If the placement information indicates that a design goal would be improved by placing at least one of the abstract blocks into a different logic block, that abstract block is removed from its logic block at step 504, and placed into a different logic block at step 505.

Figure 6:
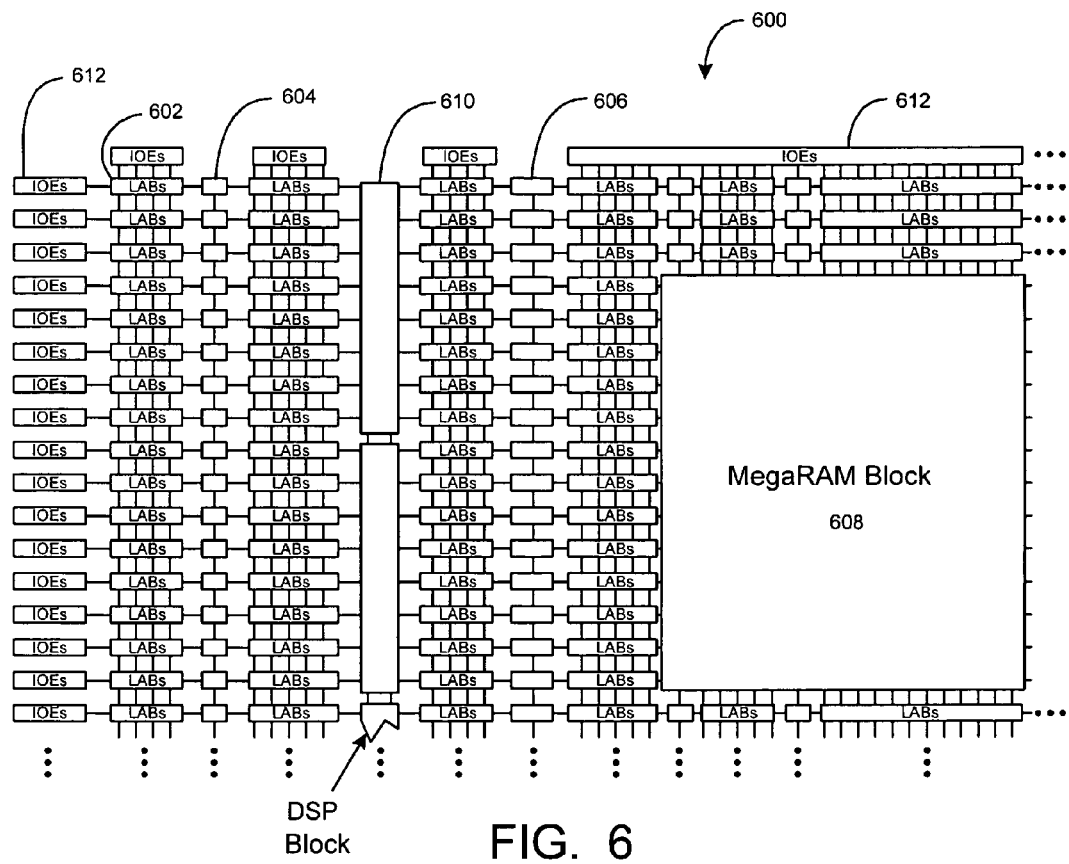
FIG. 6 is a simplified block diagram of a programmable logic device that can implement embodiments of the present invention.

The techniques of the present invention can be implemented to place user design for many different types of programmable ICs. FIG. 6 illustrates an example of one type of programmable IC architecture that can be used with the techniques of the present invention. PLD 600 includes a two-dimensional array of programmable logic array blocks (or LABs) 602 that are interconnected by a network of column and row interconnects of varying length and speed. LABs 602 include multiple (e.g., 10) logic elements (or LEs). An LE is a type of logic block.

PLD 600 also includes a distributed memory structure including RAM blocks of varying sizes provided throughout the array. The RAM blocks include, for example, 512 bit blocks 604, 4 K blocks 606, and a MegaBlock 608 providing 512 K bits of RAM. These memory blocks can also include shift registers and FIFO buffers. PLD 600 further includes digital signal processing (DSP) blocks 610 that can implement, for example, multipliers with add or subtract features. I/O elements (IOEs) 612 located, in this example, around the periphery of the device support numerous single-ended and differential I/O standards. It is to be understood that PLD 600 is described herein for illustrative purposes only and that the present invention can be implemented in many different types of PLDs, FPGAs, and the like.

Figure 7:
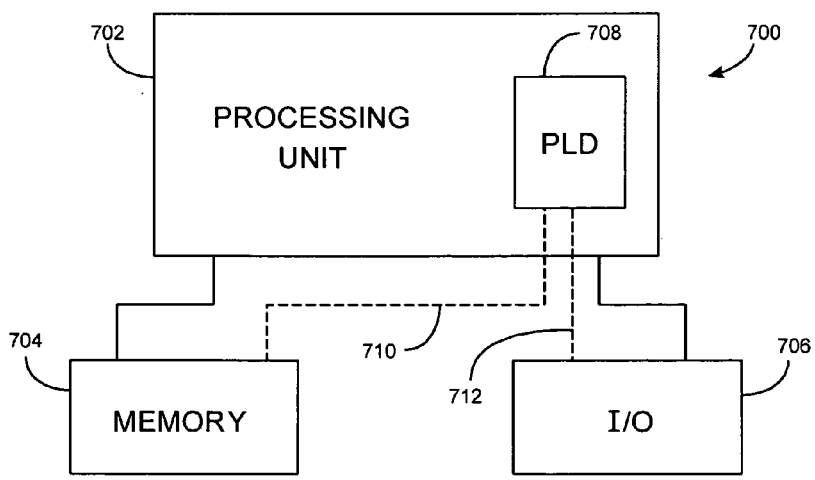
FIG. 7 is a block diagram of an electronic system that can implement embodiments of the present invention.

While PLDs of the type shown in FIG. 6 provide many of the resources required to implement system level solutions, the present invention can also benefit systems wherein a PLD is one of several components. FIG. 7 shows a block diagram of an exemplary digital system 700, within which the present invention can be embodied. System 700 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 700 can be provided on a single board, on multiple boards, or within multiple enclosures.

System 700 includes a processing unit 702, a memory unit 704 and an I/O unit 706 interconnected together by one or more buses. According to this exemplary embodiment, a programmable logic device (PLD) 708 is embedded in processing unit 702. PLD 708 can serve many different purposes within the system in FIG. 7. PLD 708 can, for example, be a logical building block of processing unit 702, supporting its internal and external operations. PLD 708 is programmed to implement the logical functions necessary to carry on its particular role in system operation. PLD 708 can be specially coupled to memory 704 through connection 710 and to I/O unit 706 through connection 712.

Processing unit 702 can direct data to an appropriate system component for processing or storage, execute a program stored in memory 704 or receive and transmit data via I/O unit 706, or other similar function. Processing unit 702 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLDs 708 can control the logical operations of the system. In an embodiment, PLD 708 acts as a reconfigurable processor, which can be reprogrammed as needed to handle a particular computing task. Alternately, programmable logic device 708 can itself include an embedded microprocessor. Memory unit 704 can be a random access memory (RAM), read only memory (ROM), fixed or flexible disk media, PC Card flash disk memory, tape, or any other storage means, or any combination of these storage means.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiment disclosed, but that the invention will include all embodiments and equivalents falling within the scope of the claims.

What is claimed is:

1. A method for designing a programmable logic device, the method comprising:

assigning each of a plurality of circuit elements to a separate abstract block, wherein the circuit elements are part of a user design for a programmable integrated circuit and each abstract block represents a functional attribute of its assigned circuit element;

placing a respective one or more of the abstract blocks into each of a plurality of logic blocks based at least in part on a correspondence between a functional attribute of a particular logic block and the functional attribute of a respective abstract block placed into that logic block, wherein a first abstract block is placed into a first logic block, wherein placing a respective one or more of the abstract blocks into each of a plurality of logic blocks includes:

determining whether placing an abstract block assigned to a particular circuit element into a specific logic block violates any of a set of design rules relating to that specific logic block, wherein the logic blocks are grouped into clusters; and determining whether placing the abstract block into a cluster containing that specific logic block violates any of a set of design rules relating to that cluster;

removing the first abstract block from the first logic block in response to placement information that indicates a design goal would be improved by rearranging at least a portion of the user design, wherein the design goal includes at least one of routability and signal timing in the user design; and placing the first abstract block into a second logic block on the programmable integrated circuit, wherein the functional attribute of the first abstract block corresponds with a functional attribute of the second logic block, thus improving the design goal.

2. The method according to claim 1 wherein the design goal includes both routability and signal timing in the user design.

3. The method according to claim 1 wherein the circuit elements include lookup tables and registers.

4. The method according to claim 1 wherein the circuit elements include DSP blocks and RAM blocks.

5. The method according to claim 1 wherein each of the abstract blocks are grouped into a cluster based on an attraction of the abstract block to the cluster, and the attraction measures a number of nets and connections of nets absorbed into the cluster if the abstract block is placed inside the cluster.

6. The method according to claim 1 wherein each of the abstract blocks are grouped into a cluster based on an attraction of the abstract block to the cluster, and the attraction measures a number of timing critical connections absorbed into the cluster if the abstract block is placed inside the cluster.

7. The method according to claim 1 wherein placing a respective one or more of the abstract blocks into each of a plurality of logic blocks further includes:

placing the abstract block into another logic block within the same cluster if placing that abstract block into that specific logic block violates any of the design rules relating to that specific logic block; and placing the abstract block into another cluster if placing that abstract block into that cluster violates any of the design rules relating to that cluster.

8. The method according to claim 1 wherein the logic blocks implement functions performed by two lookup tables with less than an integer k unique input variables; and the method further comprises:

determining whether placing an abstract block into a logic block causes that logic block to have more than k unique input variables.

9. The method according to claim 1 wherein the placement information includes floorplanning information.

10. The method according to claim 1 wherein the placement information includes partition information.

11. The method according to claim 1 wherein the placement information includes data obtained by a previous placement of a portion of the user design on the programmable integrated circuit.

12. The method of claim 1, wherein each logic block includes a first functional attribute and a second functional attribute, and wherein placing each of the abstract blocks into a logic block further comprises:
    assigning the first abstract block associated with a first circuit element to the first functional attribute of the first logic block; and
    assigning a second abstract block associated with a second circuit element to the second functional attribute of the first logic block, such that the first logic block is assigned the functional attributes of the first and second circuit elements.

13. The method of claim 12, wherein the first functional attribute of the logic block includes a register and the functional attribute of the first circuit element includes a register.

14. The method of claim 12, wherein the second functional attribute of the logic block includes a look-up table circuit adapted to implement a logic function and the functional attribute of the first circuit element includes a logic function capable of being implemented by the look-up table circuit.

15. The method of claim 1 wherein a second abstract block is placed into the first logic block prior to removing the first abstract block.

16. A computer program product stored on a computer readable medium encoded with computer program instructions for controlling operation of a computer system for designing a programmable integrated circuit, the computer program product comprising:
    computer program instructions for assigning each of a plurality of circuit elements to a separate abstract block, wherein each abstract block represents a functional attribute of its assigned circuit element;
    computer program instructions for placing a respective one or more of the abstract blocks into each of a plurality of logic blocks based at least in part on a correspondence between a functional attribute of a particular logic block and the functional attribute of a respective abstract block placed into that logic block, wherein a first abstract block is placed into a first logic block, wherein the logic blocks are grouped into clusters of logic blocks, and wherein the computer program instructions for placing a respective one or more of the abstract blocks into each of a plurality of logic blocks includes:
        computer program instructions for determining whether placing the abstract blocks into the clusters violates any design rules of the clusters; and
        computer program instructions for determining whether placing the abstract blocks into the logic blocks violates any design rules of the logic blocks;
    computer program instructions for determining whether placement information indicates that a design goal would be improved by moving at least one of the abstract blocks into a different logic block, wherein the design goal includes at least one of routability and signal timing in the user design; and
    computer program instructions for removing the first abstract block from a first logic block and placing the first abstract block into a second logic block in response to the determination based on the placement information, wherein the functional attribute of the removed first abstract block corresponds with a functional attribute of the second logic block.

17. The computer program product as defined in claim 16 wherein the design goal includes both signal timing and routability in the user design.

18. The computer program product as defined in claim 16, further comprising computer program instructions for grouping each of the abstract blocks into a cluster of logic blocks based on an attraction of the abstract block to the cluster.

19. The computer program product as defined in claim 18 wherein the attraction measures a number of nets and connections of nets absorbed into the cluster if the abstract block is placed inside the cluster.

20. The computer program product as defined in claim 18 wherein the attraction measures a number of timing critical connections absorbed into the cluster if the abstract block is placed inside the cluster.

21. The computer program product as defined in claim 16 wherein some of the circuit elements are lookup tables, and some of the circuit elements are registers.

22. The computer program product as defined in claim 16 further comprising:
    computer program instructions for placing one of the abstract blocks into another logic block if placing that abstract block to the logic block violates any of the design rules relating to the logic block in which that abstract block was first placed.

23. The computer program product as defined in claim 16 further comprising:
    computer program instructions for placing one of the abstract blocks to another cluster if placing that abstract block to the first cluster violates any of the design rules relating to the first cluster.

24. The computer program product as defined in claim 16 further comprising:
    computer program instructions for determining whether placing the abstract blocks into the logic blocks causes any of the logic blocks to have more than k unique input variables,
    wherein the logic blocks are configurable to implement functions performed by two lookup tables with less than k unique input variables.

25. The computer program product as defined in claim 16 wherein the placement information includes floorplanning information.

26. The computer program product as defined in claim 16 wherein the placement information includes partition information.

27. The computer program product as defined in claim 16 wherein the placement information includes data obtained by placing logic blocks that implement portions of the user design on the programmable integrated circuit.

* * * * *